US006774470B2

United States Patent
Yagi et al.

(10) Patent No.: US 6,774,470 B2
(45) Date of Patent: Aug. 10, 2004

(54) NON-CONTACT DATA CARRIER AND METHOD OF FABRICATING THE SAME

(75) Inventors: Hiroshi Yagi, Tokyo-to (JP); Masanao Watanabe, Tokyo-to (JP); Takeshi Sekiguchi, Tokyo-to (JP); Chikao Ikenaga, Tokyo-to (JP); Makoto Nakamura, Kamifukuoka (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 10/327,657

(22) Filed: Dec. 24, 2002

(65) Prior Publication Data

US 2003/0122233 A1 Jul. 3, 2003

(30) Foreign Application Priority Data

Dec. 28, 2001 (JP) .......................................... 2001-399278

(51) Int. Cl.⁷ .............................................. H01L 23/02
(52) U.S. Cl. ........................................ 257/679; 257/787
(58) Field of Search ................................. 257/679, 787, 257/784, 528

(56) References Cited

U.S. PATENT DOCUMENTS 5,336,931 A     8/1994  Juskey et al. ............... 257/787
5,852,289 A  * 12/1998  Masahiko .................... 235/492
6,308,894 B1 * 10/2001  Hirai et al. .................. 235/492
6,373,447 B1 *  4/2002  Rostoker ..................... 343/695
2001/0011685 A1  8/2001  Fries et al. .................. 235/492

FOREIGN PATENT DOCUMENTS

| EP | 1048483 A1 | 11/2000 |
| EP | 1118960 A2 | 7/2001 |
| EP | 1154473 A2 | 11/2001 |
| JP | 10-337982 | 12/1998 |
| WO | WO 00/14680 | 3/2000 |

* cited by examiner

Primary Examiner—Roy Potter
(74) Attorney, Agent, or Firm—Parkhurst & Wendel, L.L.P.

(57) ABSTRACT

A non-contact data carrier includes a semiconductor device (11), a coil antenna (12), and a sealing resin coating (13) sealing the semiconductor device (11) and the coil antenna (12) therein. The electrodes (11a) of the semiconductor device (11) are connected to the opposite ends (12a, 12b) of the coil antenna (12) by wires (14). The surface of the coil antenna (12) opposite to the sealing resin coating (13) is covered with a protective layer (16) for protection.

2 Claims, 5 Drawing Sheets

NON-CONTACT DATA CARRIER AND METHOD OF FABRICATING THE SAME

TECHNICAL FIELD

The present invention relates to a non-contact data carrier and a method of fabricating the same.

BACKGROUND ART

A non-contact data carrier is provided with a memory capable of storing various data and is capable of non-contact communication with external reader/writer. Non-contact data carriers are used for automatic package sorting, inventory control, commodity protection from theft, production management and distribution management.

Such a non-contact data carrier is fabricated by the following procedure. An antenna pattern is formed by etching a metal foil, such as an aluminum foil, laminated to a substrate of a resin through a resist pattern. Then, a jumping circuit is formed by forming conductive members on the back surface of the substrate and connecting the antenna pattern through through holes to the conductive members. An IC chip provided with bumps is located such that the bumps correspond to antenna connecting terminals, and the bumps are electrically connected to the antenna connecting terminals. Then, the antenna pattern and the IC chip are covered with a protective coating.

In fabricating this non-contact data carrier, the jumping circuit must be formed by connecting the antenna pattern and the conductive members through the through holes, the IC chip provided with the bumps must be located relative to the antenna connecting terminals, and the bumps formed on the back surface of the IC chip must be electrically connected to the antenna connecting terminals. Since the antenna pattern and the IC chip are separately manufactured, the cost of the non-contact data carrier is high.

Thus, the manufacturing cost of non-contact data carriers is high. Although dependent on configuration, it is said that non-contact data carriers using a microwave of the 2.45 GHz frequency band cost 5 to 100 odd dollars ("Micro Stamp presented by Mitsui & Co., Ltd. http://www.mbd.co.ip/mc/rfid.00.html").

DISCLOSURE OF THE INVENTION

It is an object of the present invention to provide a non-contact data carrier capable of being fabricated at a manufacturing cost lower than that of the conventional non-contact data carriers, and a method of fabricating the non-contact data carrier.

According to one aspect of the present invention, a non-contact data carrier comprises: a semiconductor device; a coil antenna having opposite ends; wires connecting the semiconductor device and the opposite ends of the coil antenna; and a sealing resin coating encapsulating the semiconductor device, the coil antenna and the wires therein.

In the non-contact data carrier according to the present invention, the semiconductor device is mounted on a semiconductor device mount substantially provided on the same plane as that of the coil antenna.

In the non-contact data carrier according to the present invention, a protective layer is formed on surfaces of the coil antenna and the semiconductor device mount opposite to the side of the sealing resin coating.

According to another aspect of the present invention, a non-contact data carrier fabricating method comprises the steps of: preparing a conductive substrate; forming a first resist pattern layer provided with openings on one of the surfaces of the conductive substrate, and forming a second resist pattern layer provided with openings on the other surface of the conductive substrate; forming locating holes in the substrate by coating the first resist pattern layer with a protective film and etching the conductive substrate through the openings of the second resist pattern layer; forming a coil antenna having opposite ends, and a semiconductor device mount by removing the protective film from the first resist pattern layer and plating the conductive substrate through the openings of the first resist pattern layer; removing the first and the second resist pattern layer from the conductive substrate; fixedly mounting a semiconductor device on the semiconductor device mount and connecting the opposite ends of the coil antenna to the semiconductor device; encapsulating the semiconductor device, the coil antenna, the wires and the surroundings of the semiconductor device mount with a sealing resin coating; and removing the conductive substrate from the semiconductor device mount and the coil antenna.

In the non-contact data carrier fabricating method according to the present invention, one of the surfaces of the conductive substrate is roughened by a sandblasting process to form irregularities therein before forming the fist resist pattern layer.

In the non-contact data carrier fabricating method according to the present invention, an oxide film is formed on the roughened surface of the conductive substrate by using an oxidizing solution.

In the non-contact data carrier fabricating method according to the present invention, a protective layer is formed on the surfaces of the coil antenna and the semiconductor device mount opposite to the side of the sealing resin coating after removing the conductive substrate from the semiconductor device mount and the coil antenna.

In the non-contact data carrier fabricating method according to the present invention, a plurality of semiconductor devices and a plurality of coil antennas respectively corresponding to the semiconductor devices are formed on the conductive substrate, and the sealing resin coating is cut and divided into divisions, each including one of the semiconductor devices and the coil antenna corresponding to the semiconductor device after removing the conductive substrate from the semiconductor mounts and the coil antennas.

The non-contact data carrier does not need any work for forming the jumping circuit by connecting the antenna pattern to the conductive member through the through holes, locating the IC chip with its bumps coincided with the antenna connecting terminals or electrically connecting the bumps to the antenna connecting terminals. Since the non-contact data carrier can be fabricated by steps of simply placing the semiconductor device on the semiconductor device mount and connecting the semiconductor device to the coil antenna by the wires, the non-contact data carrier of the present invention can be manufactured at a low cost.

Although the non-contact data carrier of the present invention is small and has a short communication distance, the communication distance can be extended by providing a label or a card of a tag body with a booster antenna when the non-contact data carrier is used as a tag.

An antenna pattern having a proper inductance may be formed on the surface of the sealing resin coating or the protective layer or on both the surfaces of the sealing resin coating and the protective layer, and the antenna pattern may be used as a component of a booster antenna or a resonance circuit. When such an antenna pattern is used, the antennal pattern may be electrically connected through via holes or through holes to the coil antenna so that the antenna pattern may resonate with the coil antenna. An additional antenna may be formed without forming any via holes or through holes, a proper pattern may be formed on the antenna, and an insulating layer, such as the sealing resin coating or the protective layer, may be used as a component of capacitor, and those may be used for resonation.

BEST MODE FOR CARRYING OUT THE INVENTION

Preferred embodiments of the present invention will be described with reference to the accompanying drawings.

Figure 1:
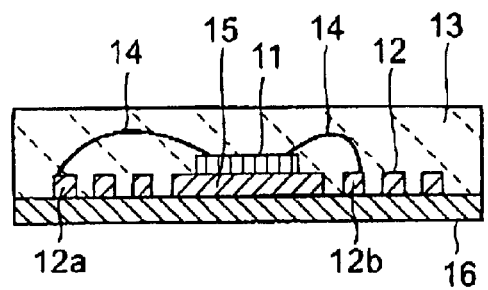
FIG. 1 is a sectional view of a non-contact data carrier according to the present invention.
Figure 2:
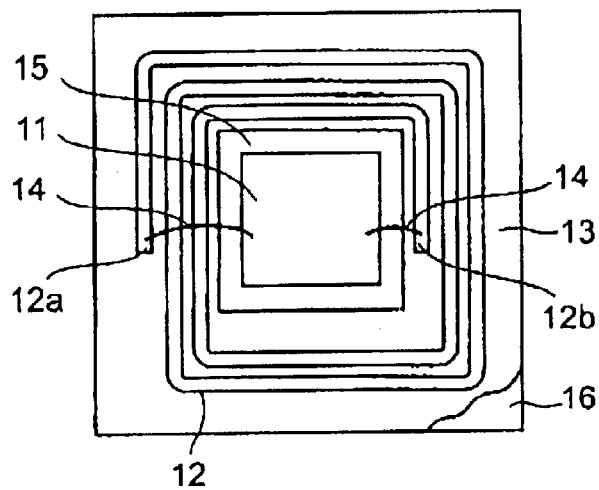
FIG. 2 is a plan view of the non-contact data carrier according to the present invention.

FIG. 1 is a sectional view of a non-contact data carrier according to the present invention and FIG. 2 is a plan view of the non-contact data carrier.

Referring to FIGS. 1 and 2, the non-contact data carrier includes a semiconductor device 11, a coil antenna 12 surrounding the semiconductor device 11 and having opposite ends 12a and 12b, and wires 14 connecting the opposite ends 12a and 12b of the coil antenna 12 to the semiconductor device 11. The semiconductor device 11 is mounted on a semiconductor device mount 15 having substantially the same plane as that of the coil antenna 12. The semiconductor device 11, the coil antenna 12, the semiconductor device mount 15 and the wires 14 are encapsulated by a sealing resin coating 13.

Surfaces of the coil antenna 12 and the semiconductor device mount 15 opposite to the side of the sealing resin coating 13 are covered for protection with a protective layer 16 formed of a solder resist.

Figure 3:
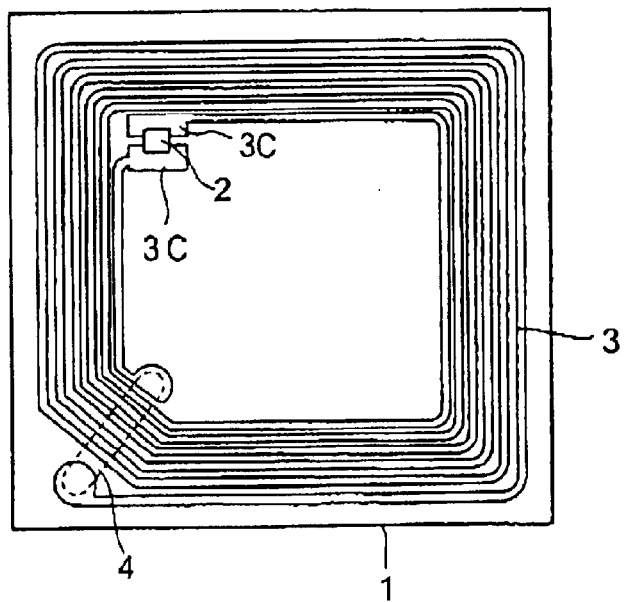
FIG. 3 is a plan view of a non-contact data carrier in a comparative example.

FIG. 3 shows a non-contact data carrier in a comparative example.

In the non-contact data carrier shown in FIG. 3, a resonance circuit is formed by a coil antenna pattern 3 formed on a substrate 1 of a plastic material, and a capacitor connected to the coil antenna pattern 3 to receive and send out radio waves of a fixed frequency. Generally, medium waves of 125 kHz and microwaves of 13.56 MHz and 2.45 GHz are used for communication.

In the non-contact data carrier shown in FIG. 3, a jumping circuit is formed by connecting the coil antenna pattern 3 through through holes to a conductive member 4 formed on the back surface of the substrate 1. The connecting terminals 3c of the coil antenna pattern 3 are connected to bumps formed on the back surface of AN IC chip 2. In the non-contact data carrier shown in FIG. 3, a capacitor is included in the IC chip.

As apparent from FIG. 1, the non-contact data carrier of the present invention does not need any work for forming a jumping circuit by connecting an antenna pattern to a conductive member through through holes, locating an IC chip with its bumps coincided with antenna connecting terminals, or electrically connecting the bumps to the antenna connecting terminals. Since the non-contact data carrier of the present invention needs simple steps of placing the semiconductor device on the semiconductor device mount, and connecting the electrodes of the semiconductor device to the opposite ends of the coil antenna by the wires, the non-contact data carrier of the present invention can be manufactured at a low cost as compared with the non-contact data carrier in a comparative example.

Figure 4:
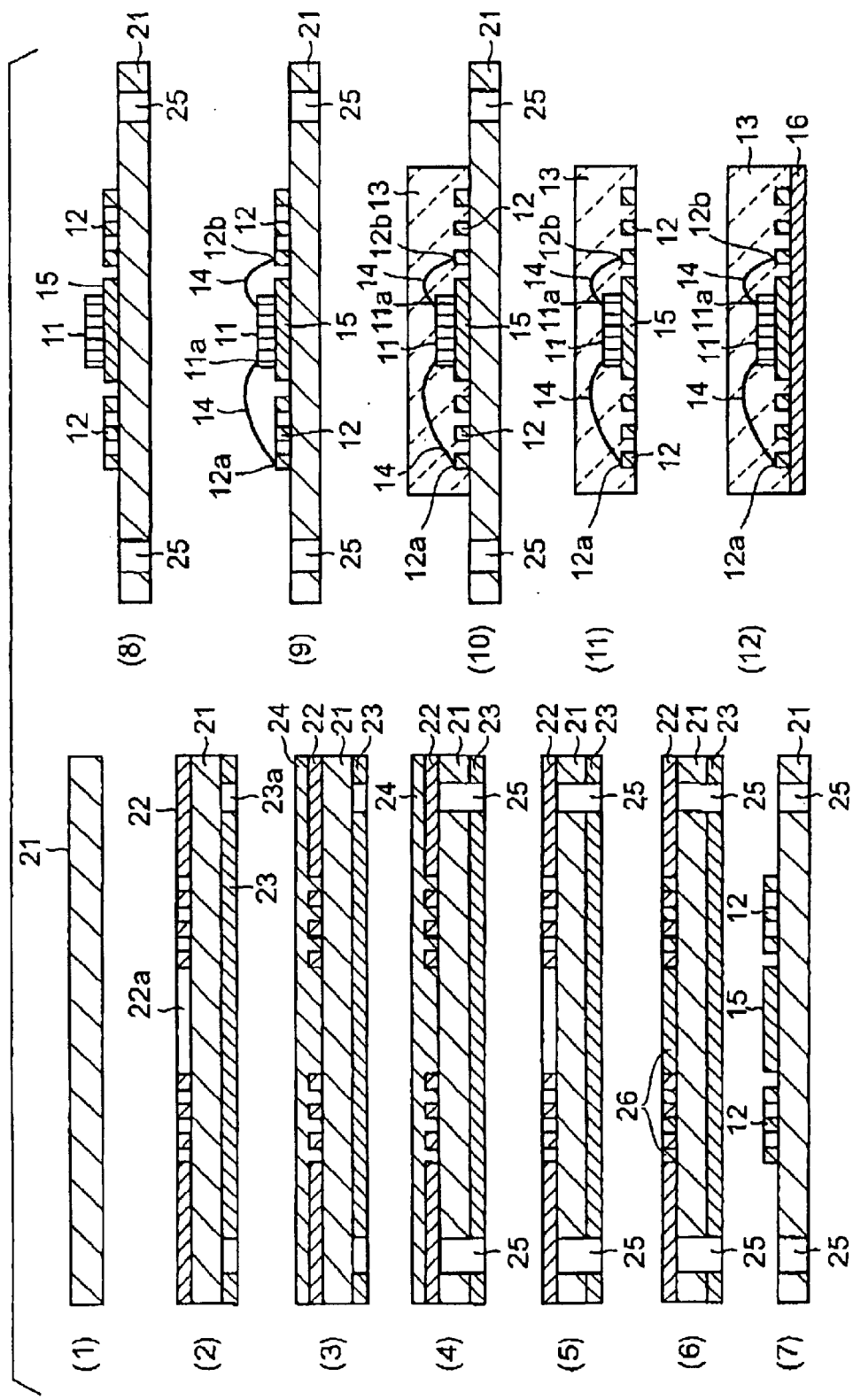
FIG. 4 is sectional views of a workpiece in successive phases of a first non-contact data carrier fabricating method according to the present invention.

Non-contact data carrier fabricating methods according to the present invention will be described. FIG. 4 illustrates a first non-contact data carrier fabricating method according to the present invention. Referring to FIG. 4, a conductive substrate 21 of a copper alloy, 42 alloy or a stainless steel, such as SUS430 or SUS304 (JIS), is prepared. A surface of the conductive substrate 21 on which a coil antenna is to be formed is roughened by sandblasting to form irregularities 21a therein. The surface provided with the irregularities 21a of the conductive substrate 21 is subjected to a separating layer forming process by oxidizing the surface having the irregularities 21a with a chromic acid solution (oxidizing solution) to form an oxide film 21b. The oxide film 21b facilitates the separation of a conductive metal film and a sealing resin coating, which are formed by later processes, from the conductive substrate 21 (FIGS. 4(1) and 7).

Then, photosensitive resist layers of a dry film resist are formed on both the surfaces of the conductive substrate 21. The photosensitive resist layers are subjected to an exposure process and a developing process to form a first resist pattern layer 22 provided with openings 22a corresponding to a coil antenna and a semiconductor device mount for a non-contact data carrier on the surface treated for roughening and removal facilitation of the conductive substrate 21, and to form a second resist pattern 23 provided with openings 23a corresponding to locating holes on the other surface of the conductive substrate 21 (FIG. 4(2)).

Generally, the dry film resist is a three-layer structure consisting of a base film, a resist film formed on the base film, and a protective coating film. When the protective coating film is peeled off, the resist film is exposed to light. The dry film resist is applied to the conductive substrate 21 with the resist film in close contact with the surface of the conductive substrate 21, and then the base film is removed to form the photosensitive resist layer on the surface of the conductive substrate 21.

The first resist pattern layer 22 and the second resist pattern layer 23 may be formed by a printing process, such as a screen printing process or a gravure printing process.

Then, the first resist pattern layer 22 formed on the conductive substrate 21 is coated with a corrosion-resistant protective film 24, such as a polyethylene terephthalate film (FIG. 4(3)).

Parts of the conductive substrate 21 corresponding to the openings 23a of the second resist pattern layer 23 are etched to form locating holes 25 (FIG. 4(4)).

Then, the protective film 24 is removed, the first resist pattern layer 22 is exposed (FIG. 4(5)), and parts of the conductive substrate 21 corresponding to the openings 22a of the first resist pattern layer 22 are plated with a film of Au, Ag, Cu, Pd or Ni or with a multilayer film of some of those materials (FIG. 4(6)). Then, the first resist pattern layer 22 is immersed in a stripping liquid to remove the same from the conductive substrate 21, and then the conductive substrate 21 is subjected to a cleaning process or the like to complete a coil antenna 12 and a semiconductor device mount 15 (FIG. 4(7)). The second resist pattern layer 23 is removed together with the first resist pattern layer 22.

Then, a semiconductor device 11 is fixedly mounted on the semiconductor device mount 15 (FIG. 4(8)).

Then, the electrodes 11a of the semiconductor device 11 are connected to the opposite ends 12a and 12b of the coil antenna 12 by wire bonding using wires 14 of a noble metal, such as Au (FIG. 4(9)). The wire bonding using the wires 14 may be carried out by a wire bonding machine, such as a thermocompression wire bonder using only heating and compressing, a ultrasonic thermocompression wire bonder using heating, compressing and ultrasonic waves or a wedge bonder using only ultrasonic vibrations at an ordinary temperature.

Then, the coil antenna 12, the semiconductor device 11 and the wires 14 are encapsulated by a sealing resin coating 13 of an epoxy resin or the like (FIG. 4(10)). During this molding process, the metal films forming the coil antenna 12 and the semiconductor device mount 15 can adhere firmly to the conductive substrate 21, withstand pressure, particularly, lateral pressure, that acts thereon during the molding process and therefore the coil antenna 12 and the semiconductor device mount 15, never come off the conductive substrate 21 because the surface the conductive substrate 21 on which the coil antenna 12 and the semiconductor device mount 15 are formed has irregularities 21a.

Then, the conductive substrate 21 is separated from the coil antenna 12 and the semiconductor device 11 sealed in the sealing resin coating 13 (FIG. 4(11)). Due to the surface treatment and the separating layer forming process for the surface of the conductive substrate 21, the conductive substrate 21 can easily be separated from the coil antenna 12 and the semiconductor device 11 by exerting a force perpendicularly to the conductive substrate 21.

Then, the respective surfaces of the coil antenna 12 and the semiconductor device mount 15 opposite to the side of the sealing resin coating 13 are coated with a protective layer 16 to complete a non-contact data carrier according to the present invention (FIG. 4(12)).

A modification of the first non-contact data carrier fabricating method will be described. In the non-contact data carrier fabricating method in the modification, a conductive substrate 21 of a copper alloy is used, and a coil antenna 12 and a semiconductor device mount 15 are formed by processing a two-layer film consisting of a Cu film and a Pd film. The conductive substrate 21 is dissolved selectively in a liquid capable of dissolving Cu and incapable of dissolving Pd. The rest of steps of the modification are the same as those of the first non-contact data carrier fabricating method.

Figure 5:
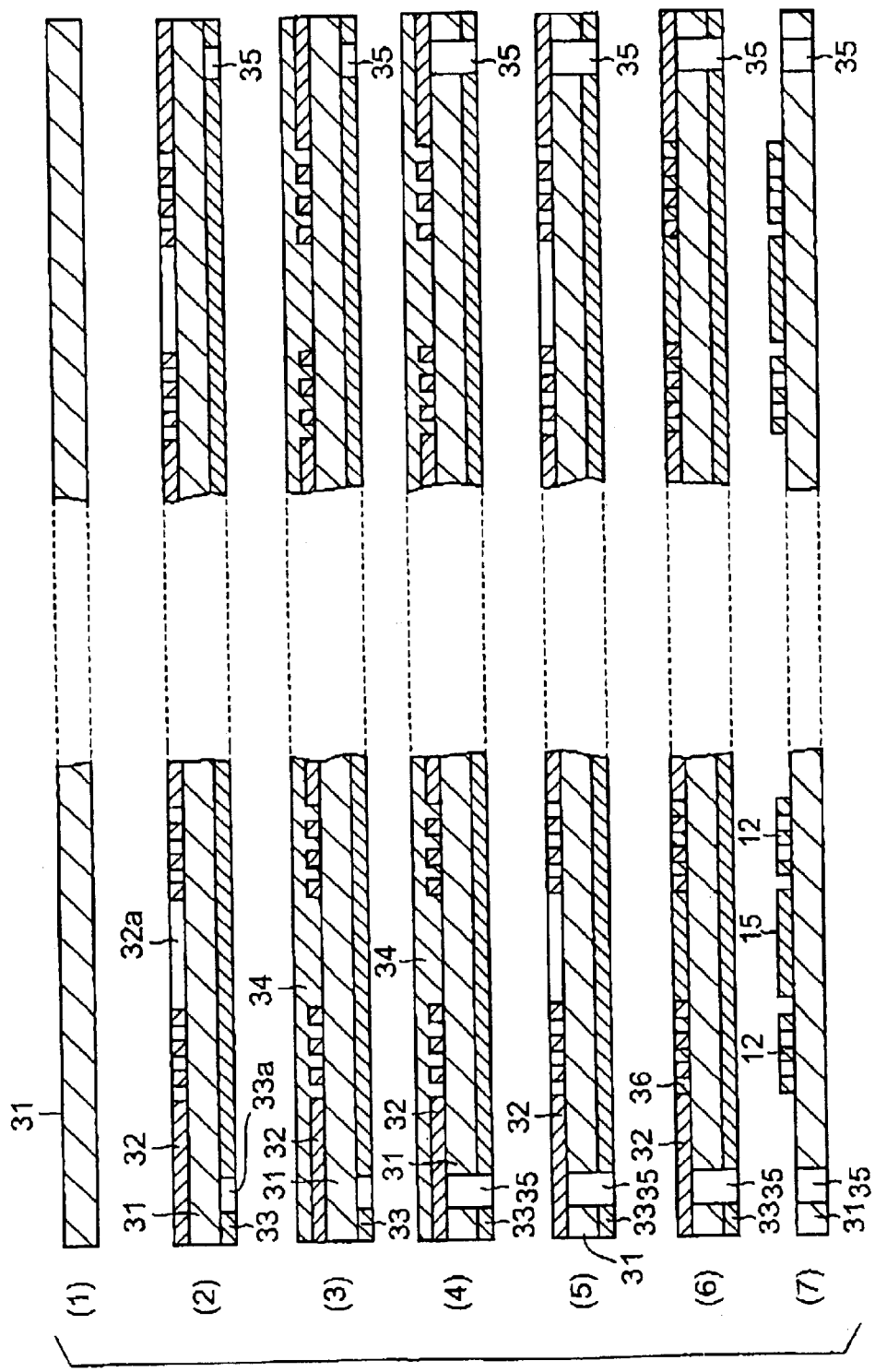
FIG. 5 is sectional views of a workpiece in successive phases of a second non-contact data carrier fabricating method according to the present invention.
Figure 6:
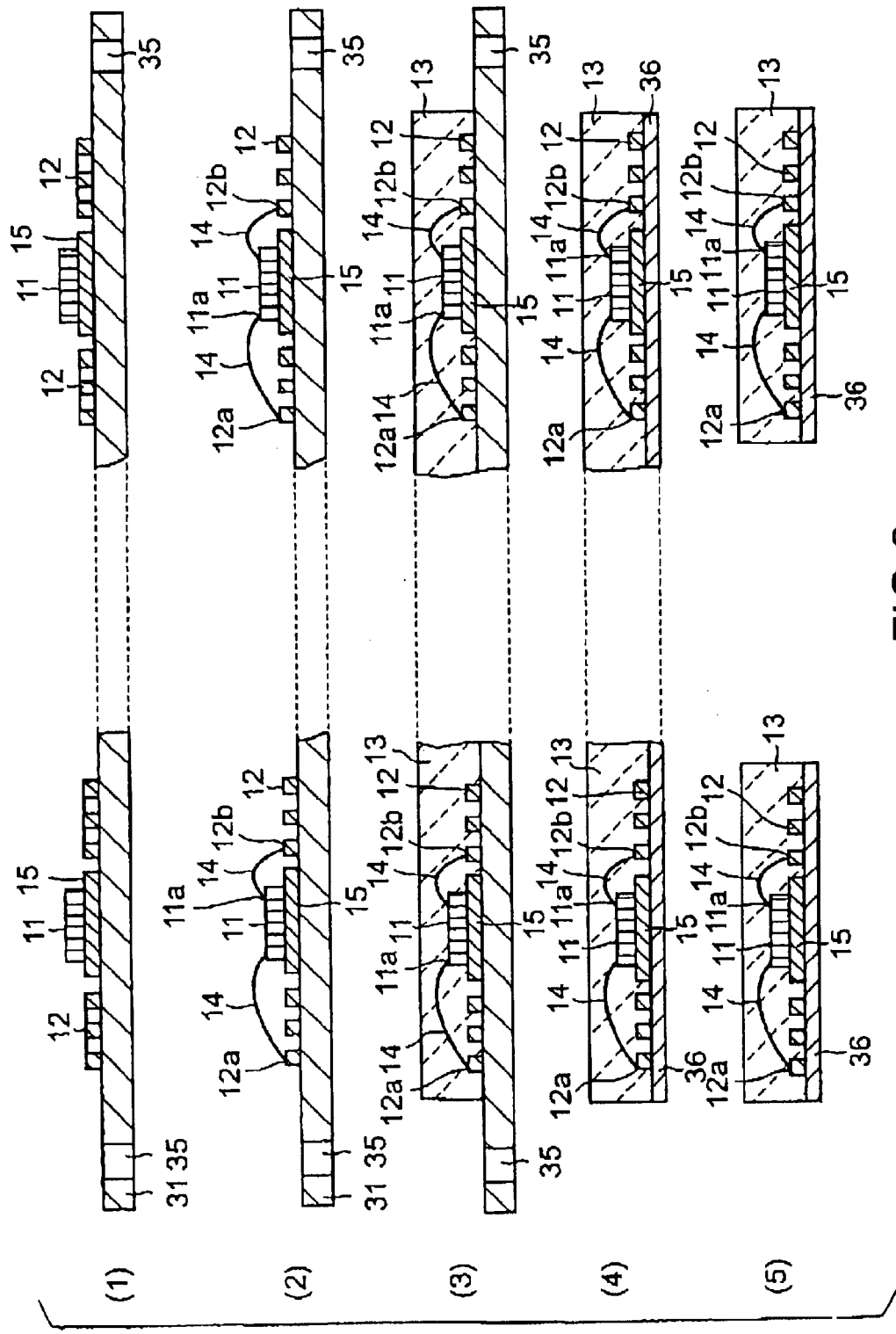
FIG. 6 is sectional views of the non-contact data carrier in successive phases following those of the second non-contact data carrier fabricating method shown in FIG. 5.
Figure 7:
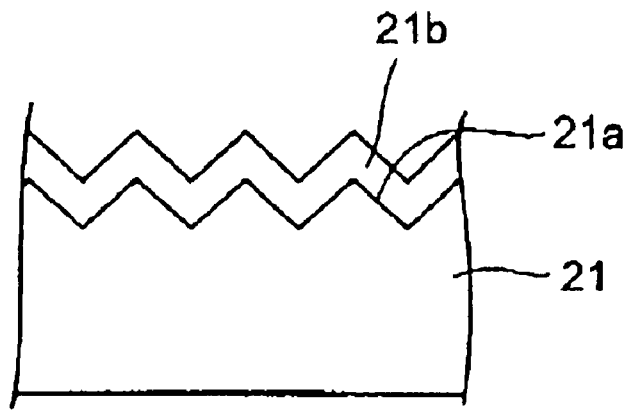
FIG. 7 is a side elevation of a substrate.
Figure 8:
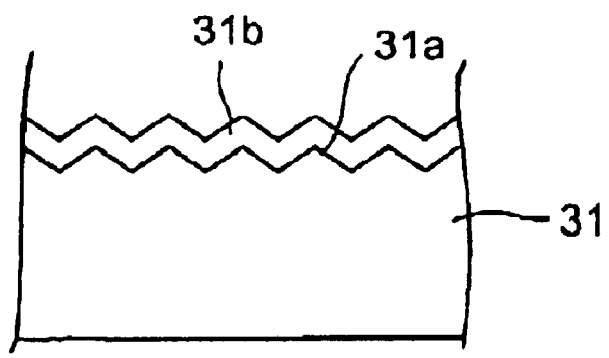
FIG. 8 is a side elevation of a substrate.

FIGS. 5 and 6 illustrates a second non-contact data carrier fabricating method. Referring to FIG. 5, a conductive substrate 31 of a copper alloy, 42 alloy or a stainless steel, such as SUS430 (JIS), is prepared. A surface of the conductive substrate 31 on which a coil antenna is to be formed is roughened by sandblasting to form irregularities 31a therein. The surface provided with the irregularities 31a of the conductive substrate 31 is subjected to a separating layer forming process by oxidizing the surface having the irregularities 31a with a chromic acid solution (oxidizing solution) to form an oxide film 31b. The oxide film 31b facilitates the separation of a conductive metal film and a sealing resin coating which are formed by later processes, from the conductive substrate 31 (FIGS. 5(1) and 8).

Then, photosensitive resist layers are formed on both the surfaces of the conductive substrate 31 by using a dry film resist. The photosensitive resist layers are subjected to an exposure process and a developing process to form a first resist pattern layer 32 provided with openings 32a corresponding to a plurality of coil antennas and a plurality of semiconductor device mounts for a plurality of non-contact data carriers on the surface treated for roughening and removal facilitation of the conductive substrate 31, and to form a second resist pattern layer 33 provided with openings 33a corresponding to locating holes on the other surface of the conductive substrate 31 (FIG. 5(2)).

The first resist pattern layer 32 and the second resist pattern layer 33 may be formed by a printing process, such as a screen printing process or a gravure printing process.

Then, the first resist pattern layer 32 formed on the conductive substrate 31 is coated with a corrosion-resistant protective film 34, such as a polyethylene terephthalate film (FIG. 5(3)).

Parts of the conductive substrate 31 corresponding to the openings 33a of the second resist pattern layer 33 are etched to form locating holes 35 (FIG. 5(4)).

Then, the protective film 34 is removed, the first resist pattern layer 32 is exposed (FIG. 5(5)), and parts of the conductive substrate 31 corresponding to the openings 32a of the first resist pattern layer 32 are plated with a film of Au, Ag, Cu, Pd or Ni or with a multilayer film of some of those materials(FIG. 5(6)). Then, the first resist pattern layer 32 is immersed in a stripping liquid to remove the same from the conductive substrate 31, and then the conductive substrate 31 is subjected to a cleaning process or the like to complete coil antennas 12 and semiconductor device mounts 15 (FIG. 5(7)). The second resist pattern layer 33 is removed together with the first resist pattern layer 32.

Then, a plurality of semiconductor devices 11 are fixedly mounted on the semiconductor device mounts 15 (FIG. 6(1)), respectively. The plurality of semiconductor devices 11 correspond to the plurality of coil antennas 12 formed on the conductive substrate 31, respectively.

Then, the electrodes 11a of the semiconductor devices 11 are connected to the opposite ends 12a and 12b of the corresponding coil antennas 12, respectively, by wire bonding using wires 14 of a noble metal, such as Au (FIG. 6(2)).

Then, the coil antennas 12, the semiconductor devices 11 and the wires 14 are encapsulated by a sealing resin coating 13 of an epoxy resin or the like (FIG. 6(3)).

Then, the conductive substrate 31 is separated from the coil antennas 12 and the semiconductor devices 11 sealed in the sealing resin coating 13, and the respective surfaces of the coil antennas 12 and the semiconductor device mounts 15 opposite to the side of the sealing resin coating 13 are coated with a protective layer 16 of solder paste or the like (FIG. 6(4)).

Then, the sealing resin coating 13 and the protective layer 36 are cut into divisions, each including one of the semiconductor device 11 and one of the coil antenna 12 corresponding to the semiconductor device 11 (FIG. 6(5)).

Thus, the second non-contact data carrier fabricating method is able to fabricate a plurality of non-contact data carriers efficiently simultaneously.

A modification of the second non-contact data carrier fabricating method will be described. In the non-contact data carrier fabricating method in the modification, a conductive substrate 31 of a copper alloy is used, and coil antennas 12 and semiconductor device mounts 15 are formed by processing a two-layer film consisting of a Cu film and a Pd film. The conductive substrate 31 is dissolved selectively in a liquid capable of dissolving Cu and incapable of dissolving Pd. The rest of steps of the modification are the same as those of the second non-contact data carrier fabricating method.

The communication distance of the non-contact data carrier of the present invention can be extended by applying a booster antenna to the non-contact data carrier.

As is apparent from the foregoing description, the non-contact data carrier of the present invention is characterized in that the semiconductor device and the coil antenna are sealed in the sealing resin coating, and that the semiconductor device is connected to the opposite ends of the coil antenna by the wires. The present invention does not need any work, that is needed by the conventional non-contact data carrier, for forming a jumping circuit by connecting an antenna pattern to a conductive member through through holes, locating an IC chip with its bumps coincided with antenna connecting terminals, or electrically connecting the bumps to the antenna connecting terminals. Thus, the non-contact data carrier of the present invention can be manufactured at a low cost as compared with the conventional non-contact data carrier.

The non-contact data carrier fabricating method of the present invention comprises the steps of forming a coil antenna and a semiconductor device mount on a substrate, mounting a semiconductor device on a semiconductor device mount, and connecting the electrodes of the semiconductor device to the opposite ends of the coil antenna by wires. The non-contact data carrier fabricating method of the present invention does not need any work, that is needed by the conventional non-contact data carrier fabricating method, for forming a jumping circuit by connecting an antenna pattern to a conductive member through through holes, locating an IC chip with its bumps coincided with antenna connecting terminals, or electrically connecting the bumps to the antenna connecting terminals. Thus, the non-contact data carrier fabricating method of the present invention is able to fabricate the non-contact data carrier at a low manufacturing cost as compared with the conventional non-contact data carrier fabricating method.

What is claimed is:

1. A non-contact data carrier comprising:

a semiconductor device;

a coil antenna so formed as to surround the semiconductor device, and having opposite ends;

wires connecting the semiconductor device and the opposite ends of the coil antenna; and a sealing resin coating encapsulating the semiconductor device, the coil antenna and the wires therein, wherein (1) the semiconductor device is mounted on a semiconductor device mount substantially provided on the same plane as that of the coil antenna and (2) the respective back surfaces of the semiconductor device mount, the coil antenna, and the sealing resin coating are placed on the same plane.

2. The non-contact data carrier according to claim 1 wherein a protective layer is formed on surfaces of the coil antenna and the semiconductor device mount opposite to the side of the sealing resin coating.

* * * * *